US 6,639,714 B2

United States Patent
Smith et al.

(10) Patent No.: US 6,639,714 B2
(45) Date of Patent: *Oct. 28, 2003

(54) INTEGRATED CIRCUIT WITH OPPOSED SPATIAL LIGHT MODULATOR AND PROCESSOR

(75) Inventors: Ronald D. Smith, Phoenix, AZ (US); Kannan Raj, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 23 days.

This patent is subject to a terminal disclaimer.

(21) Appl. No.: 10/035,643

(22) Filed: Nov. 7, 2001

(65) Prior Publication Data
US 2002/0067536 A1 Jun. 6, 2002

Related U.S. Application Data

(63) Continuation-in-part of application No. 09/430,284, filed on Oct. 29, 1999, now Pat. No. 6,348,991.

(51) Int. Cl.[7] ............ G02F 1/00; H01L 23/02; H01L 23/04
(52) U.S. Cl. .......... 359/321; 257/678; 257/698
(58) Field of Search ............... 359/321–323, 359/238, 291, 298; 257/678, 680, 698, 724, 301, 350; 438/30; 349/42, 149; 345/8

(56) References Cited

U.S. PATENT DOCUMENTS

| 5,537,234 A | 7/1996 | Williams et al. ............ 349/42 |
| 6,140,980 A | 10/2000 | Spitzer et al. ............... 345/8 |
| 6,249,327 B1 * | 6/2001 | Murade et al. ............. 349/43 |
| 6,343,171 B1 * | 1/2002 | Yoshimura et al. ......... 385/50 |
| 6,348,991 B1 * | 2/2002 | Smith et al. ............... 359/321 |

FOREIGN PATENT DOCUMENTS

| WO | WO 00/37994 | 6/2000 |
| WO | WO 01/33293 | 5/2001 |

* cited by examiner

Primary Examiner—Loha Ben
Assistant Examiner—William Choi
(74) Attorney, Agent, or Firm—Trop, Pruner & Hu, P.C.

(57) ABSTRACT

An integrated circuit may have a spatial light modulator formed on one side of a semiconductor support and a microprocessor formed on the opposite side. The microprocessor and the spatial light modulator may communicate with one another through electrical connections which extend completely through the semiconductor support. The microprocessor may be contacted using bump packaging techniques.

8 Claims, 3 Drawing Sheets

INTEGRATED CIRCUIT WITH OPPOSED SPATIAL LIGHT MODULATOR AND PROCESSOR

This is a continuation-in-part of U.S. patent application Ser. No. 09/430,284 filed Oct. 29, 1999 now U.S. Pat. No. 6,348,991.

BACKGROUND

This invention relates generally to spatial light modulators and to microprocessors.

There is an increasing demand for relatively compact digital displays for a wide variety of electronic devices. For example, cellular telephones and a variety of other appliances have a need for a relatively compact display and in some cases an entire device may be sufficiently compact to be handheld. These devices have processor-based systems for running a variety of applications as well as the display. Conventionally, a printed circuit board is utilized to organize a variety of integrated circuit chips to implement the processor and the circuitry for a spatial light modulator. This tends to spread the size of the device laterally increasing the minimum possible device size.

A number of emerging display technologies make it possible to provide relatively compact displays. For example, reflective light valves may be based on liquid crystal on silicon (LCOS) technology to merge mature silicon technology with liquid crystal optics technology. Micro displays as are used in handheld mobile phones and rear projection displays for personal computers and home entertainment are applications of hybrid reflective light modulator technology. In addition, grating light valves from Silicon Light Machine and the Digital Micro-Mirror Device (DMMD) from Texas Instruments may also be used to create displays.

The spatial light modulator modulates the optical properties of a medium to allow an image to be displayed when the medium is exposed to light. The nature of the spatial light modulator is essentially inconsistent with the nature of the microprocessor. The microprocessor is an entirely silicon device and can be formed on a die and packaged with a variety of different contacts for connecting to the outside world. The spatial light modulator involves the use of a liquid crystal layer which is confined between a pair of spaced plates. Conventionally, the requirements for packaging liquid crystal based devices and microprocessors have been considered to be substantially different.

Thus, there is a continuing need for ways to better integrate microprocessors and spatial light modulators to achieve processor-based systems with more compact display arrangements.

DETAILED DESCRIPTION

An integrated circuit may include a spatial light modulator on one surface and a microprocessor on an opposite surface. The spatial light modulator and the microprocessor may be electrically coupled by one or more conductive interconnections that extend completely through the integrated circuit.

Figure 1:
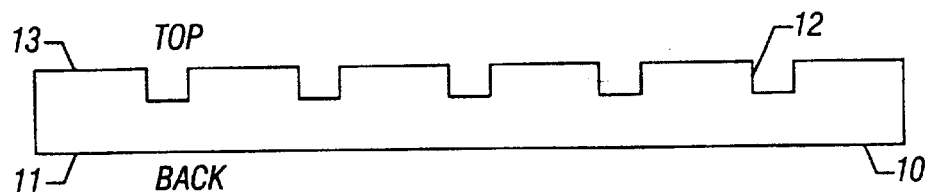
FIG. 1 is an enlarged cross-sectional view of a semiconductor support which has been etched to form an array of trenches on the top side of the support.

Referring to FIG. 1, initially a support 10 may be etched to form a plurality of discrete holes or trenches 12 on the top side 13 of the support 10. The support 10, in one embodiment of the present invention, may be formed by a P-type silicon semiconductor substrate. Alternatively, the support may include sapphire, for example in a semiconductor over insulator (SOI) technology.

Figure 2:
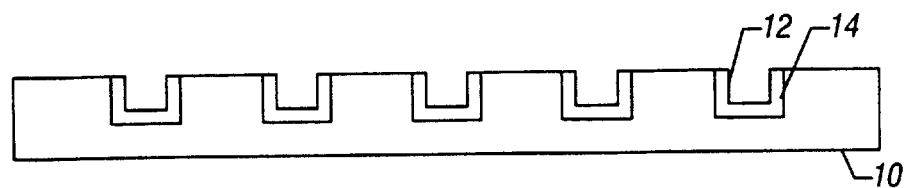
FIG. 2 is an enlarged cross-sectional view after the trenches formed in FIG. 1 have been oxidized.

The trenches 12 may be oxidized to form an oxide 14, as shown in FIG. 2. The trenches 12 that have now been oxidized, may be relatively deep trenches extending a substantial distance through the support 10. For example, the trenches 12 may extend, after oxidation, through more than half the thickness of the support 10 from the top side 13 to the back side 11. Alternatively, the oxide 14 may be deposited. As still another alternative, a dielectric such as silicon nitride may be used in place of the oxide 14.

Figure 3:
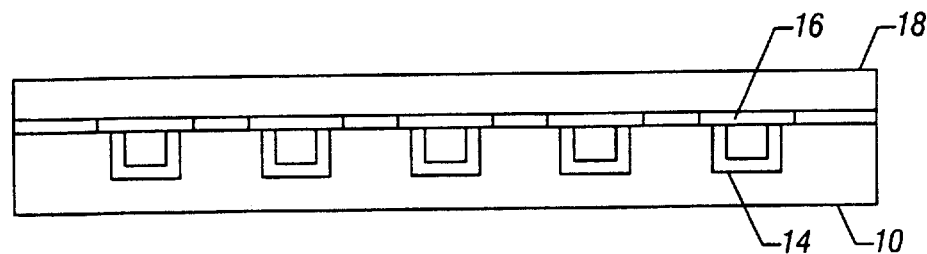
FIG. 3 is an enlarged cross-sectional view after the oxidized trenches shown in FIG. 2 have been metallized and covered with interlayer dielectric and metallization layers.

The trenches 12 may be covered by a layer of metallization which forms the so-called metal one metallization as indicated at 16 in FIG. 3. The metal one metallization 16 may be covered by an interlayer dielectric (ILD) and additional metallization layers 18. The additional metallization layers may include second, third and fourth or even higher layers of metallization with intervening dielectric layers. The metallization layers may implement the desired structure and function for a conventional microprocessor.

Figure 4:
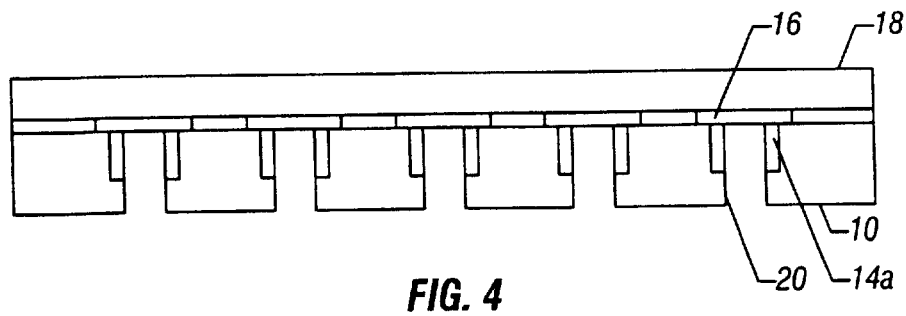
FIG. 4 is an enlarged cross-sectional view of the support shown in FIG. 3 after the support has been penetrated to form a plurality of holes which extend completely through the support.

Thereafter, as shown in FIG. 4, trenches 20 are formed from the back side 11 of the support 10 to mate up with the array of trenches 12 previously formed in the top side 13. As a result, the holes or trenches 20 extend completely through the support 10. The trenches 20 may be formed by chemical or laser ablation from the back side 11. Advantageously, they do not adversely affect the metal one layer 16.

Figure 5:
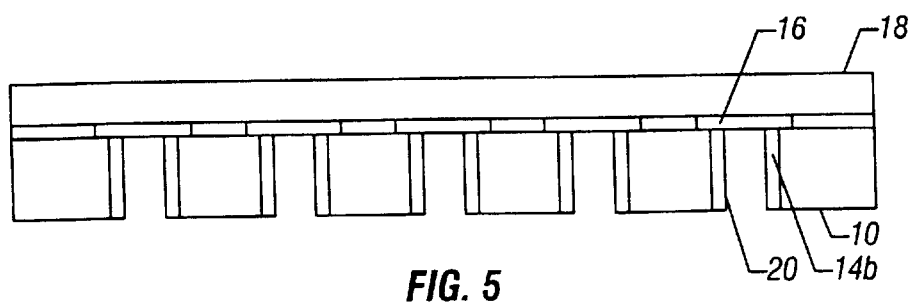
FIG. 5 is an enlarged cross-sectional view of the embodiment shown in FIG. 4 after the traversing holes have been oxidized.

Thereafter, the exposed surfaces of the trench 20 are oxidized to form a trench oxide 14 which covers the interior surface of the trench 20 as indicated in FIG. 5. The oxide 14 may also be a deposited oxide. In addition, other dielectric materials such as silicon nitride may be deposited in place of or in addition to oxide. The trenches may be formed in a circular cross-sectional shape, in one embodiment of the invention.

Figure 6:
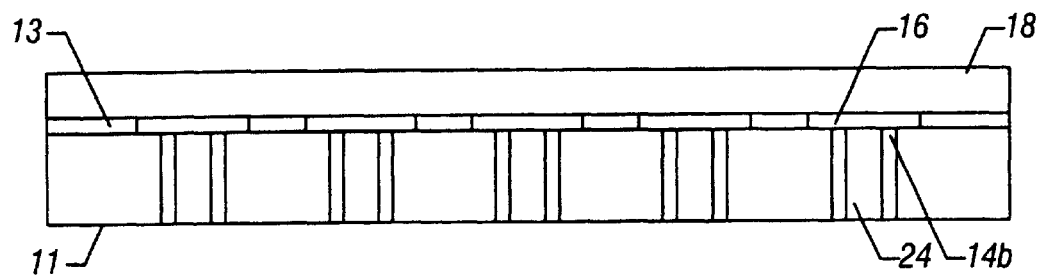
FIG. 6 is an enlarged cross-sectional view of the embodiment shown in FIG. 5 after the holes have been metallized.

Next, as shown in FIG. 6, the trenches 20 may be metallized, as indicated at 24, to form conductive vias 24 that extend from the top side 13 through to the back side 11 of the support 10. At the top side 13, the conductive vias 24 electrically contact the metal one layer 16 and on the bottom the vias electrically contact the mirror pads 26. A variety of conventional materials may be utilized to form the vias 24 including aluminum, copper and gold. In addition, it may be possible to use other conductive materials such as silicides. Instead of forming the vias 24 by a coating process, the vias 24 may be formed of a solid conductive plug substantially filling the trenches 20.

Figure 7:
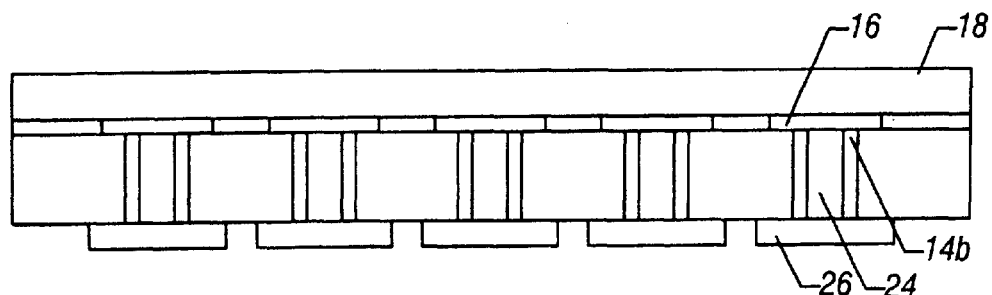
FIG. 7 is an enlarged cross-sectional view of the embodiment shown in FIG. 6 after the metallized holes have been surface metallized and polished.

Thereafter, the backside 11 is metallized and a plurality of metal pads 26 are patterned and defined as indicated in FIG. 7. The metal pads 26 form the so-called metal zero layer or mirror pads for the spatial light modulator. The metal pads 26 may be formed using liquid crystal over silicon (LCOS) technology. An alignment layer 28 may be formed over the mirror pads 26. The alignment layer 28 may be formed, for example, of an indium tin oxide. A liquid crystal material 30 is sandwiched between an alignment layer 32 coated on a transparent top plate 34 and the layer 28. The layer 32 may also be formed of indium tin oxide. Spacers (not shown) may be provided between the alignment layer 28 and the top plate 34 to maintain the desired spacing.

Figure 8:
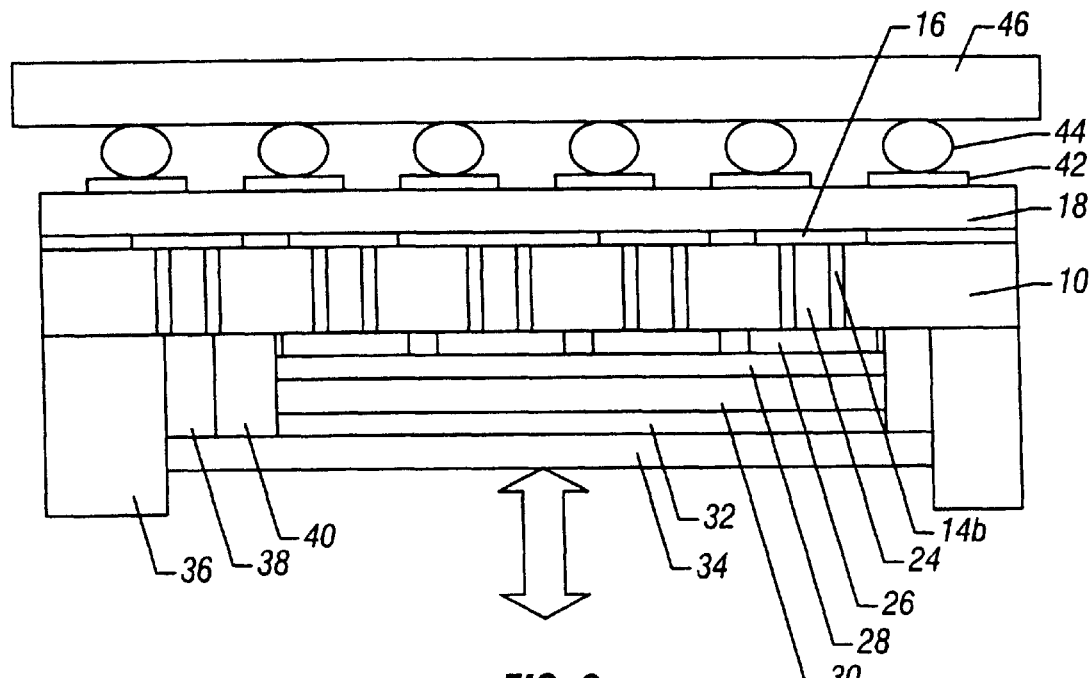
FIG. 8 is an enlarged cross-sectional view of the finished integrated circuit in accordance with one embodiment of the present invention.

A heat sink 36 may be peripherally secured to the support 10 to remove heat generated by the microprocessor and/or the spatial light modulator without interfering with photon access, indicated by double arrows, to the modulator in FIG. 8. An electrical contact 38 may be provided to electrical couple to the alignment layers 32 and 28. A seal 40 may be provided to maintain the liquid crystal material 30 between the alignment layers 28 and 32.

The support 10 may be made of P-type silicon semiconductor material and N-plus type diffusions 50 may be formed between the metal interconnects 24. The diffusions 50 may form the transistors which control the operation of the spatial light modulator.

A plurality of metal contacts 42 may be patterned and defined on top of the microprocessor for allowing input and output connections to the microprocessor. In one embodiment of the invention the contacts 42 may be formed from a metal five metallization layer. In one embodiment of the present invention, solder balls or bumps 44 may be utilized to implement a flip chip type package that couples the microprocessor inputs and outputs to a printed circuit board 46. The bumps 44 may also implement the input/output connections for the spatial light modulator through the vias 24. In another embodiment, a tape automated bonding (TAB) system may be used in place of the bumps 44.

The mirror pads 26 define the mirrors for the spatial light modulator. Potentials applied to the liquid crystal material 30 modulates the incoming light to create images. These images can be directly viewed or projected onto a projection screen. Commonly, the metal pads 26 may be rectangular or square and together form a rectangular array of mirrors. The mirror array may define an array of pixel elements in conjunction with the liquid crystal material positioned over the mirrors. The transmissivity of the liquid crystal material 30 may be controlled by the LCOS active elements formed in the support 10.

Since both sides of a die or support 10 may be utilized, some embodiments may increase the utilization of a single silicon die. In addition, the microprocessor and the spatial light modulator may be positioned in close juxtaposition. Pixel storage capacitors, that normally consume the bulk of the area in silicon liquid crystal device backplane displays, are naturally formed by the metal vias 24 and the mirror pads 26 over oxide 14b on the back side 13. This may reduce the need for large electrical devices and may allow for additional pixel plane processing transistors or the integration of other functions, such as a graphics display control or processor functions. Some embodiments may be particularly amenable for use in micro displays and rear projection displays, by making the optical system very compact, both in frame sequential and multichannel applications.

When an insulator is used to form the support 10, it is unnecessary to insulate the conductive vias 24 using an oxide or other insulative layer.

A computer system 50 in accordance with one embodiment of the present invention includes the support 10, which is coupled to a spatial light modulator 56 and microprocessor 52. The system 50 may include a system memory 58 that may be coupled to the microprocessor 52 through an interface 54. The interface 54 may be coupled to a bus 60 that may be coupled to a second interface 62 that in turn may be coupled to a second bus 64.

Figure 9:
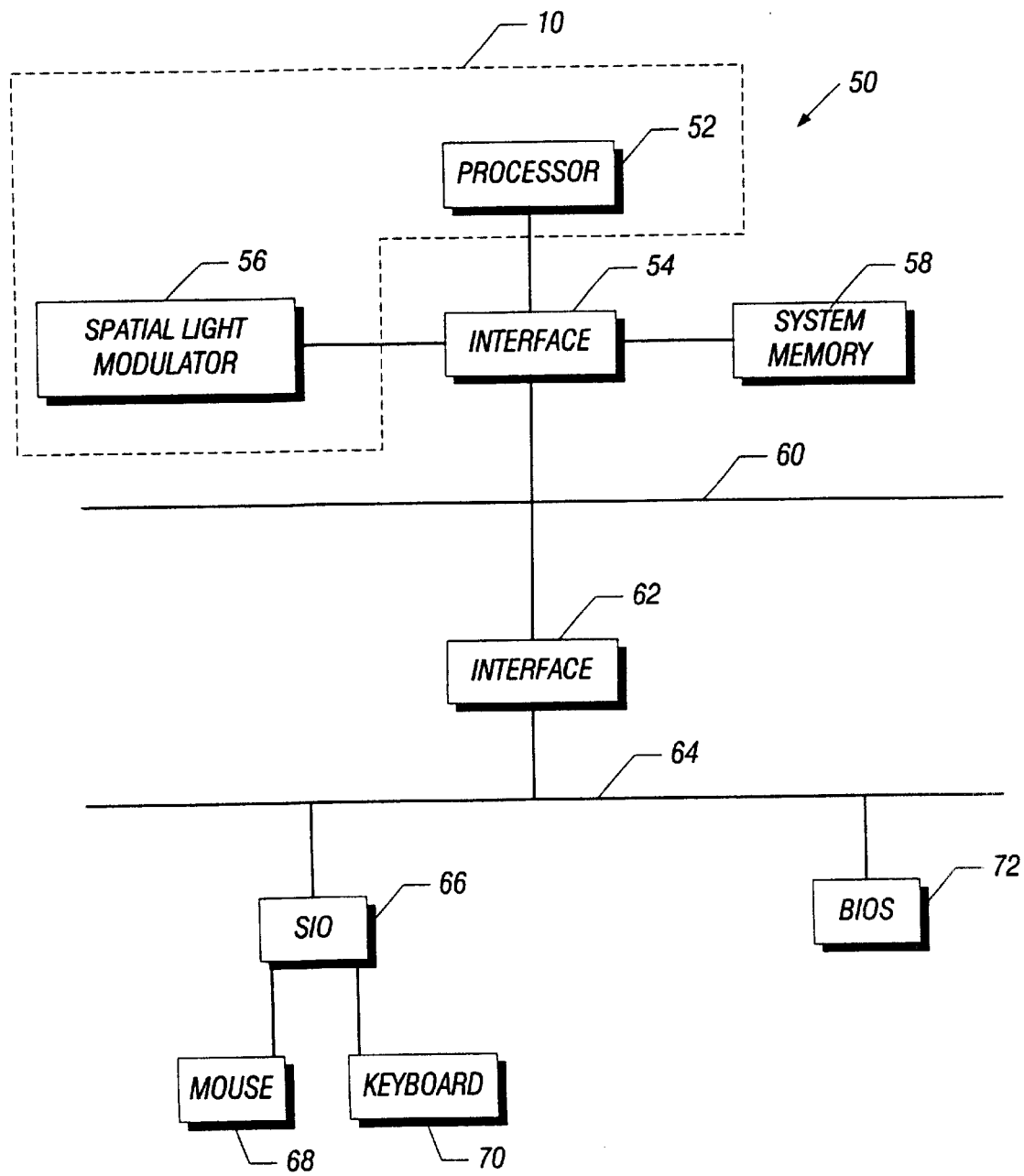
FIG. 9 is a schematic depiction of a computer system in accordance with one embodiment of the present invention.

The bus 64 may be coupled to a basic input/output system (BIOS) memory 72 and to a serial input/output (SIO) device 66. The device 66 may be coupled to a mouse 68 and a keyboard 70, for example. Of course, the architecture shown in FIG. 9 is only an example of a potential architecture that may include the integrated circuit with the support 10 on opposed sides of which the spatial light modulator 56 and the microprocessor 52 are connected.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A computer system comprising:
   a first integrated circuit including a memory; and
   a second integrated circuit coupled to the first integrated circuit, the second integrated circuit including a support of semiconductor material with opposed sides, said support including a spatial light modulator mounted on one side of said support and a microprocessor, mounted on the opposed side of said support, said microprocessor being coupled by an electrical conductor to said modulator through said support.

2. The system of claim 1 wherein said spatial light modulator of said second integrated circuit is formed using liquid crystal on silicon technology.

3. The system of claim 1 wherein said second integrated circuit includes a plurality of conductors formed as dielectric insulated vias which extend from one opposed side to the other opposed side of said support.

4. The system of claim 1 wherein said second integrated circuit includes a plurality of conductive vias which extend through said support, a plurality of mirror pads in said modulator and a plurality of conductive pads in said processor, each of said vias contacting a mirror pad in said modulator on one side of said support, and a metal pad on the other side of said support.

5. The system of claim 1 wherein said support includes a transparent conductive layer and a liquid crystal layer, an electrical contact being formed through said spatial light modulator to said conductive layer.

6. The system of claim 1 wherein said support includes a hole formed completely through said support forming a tubular wall, a dielectric layer formed on said wall and a conductive layer formed within said hole such that said dielectric layer is sandwiched between said conductive layer and said support, a mirror pad being formed in electrical contact with said conductive layer, said mirror pad forming part of said spatial light modulator.

7. The system of claim 1 including an interface coupled to said second integrated circuit.

8. The system of claim 7 including a bus coupled to said interface.

* * * * *